(12) United States Patent
Ichioka

(10) Patent No.: US 6,829,300 B1
(45) Date of Patent: Dec. 7, 2004

(54) SIGNAL PROCESSING METHOD AND DEVICE

(75) Inventor: Hidetoshi Ichioka, Kanagawa (JP)

(73) Assignee: Sony Corporation, Tokyo (JP)

( * ) Notice: Subject to any disclaimer, the term of this patent is extended or adjusted under 35 U.S.C. 154(b) by 694 days.

(21) Appl. No.: 09/786,590

(22) PCT Filed: Jul. 7, 2000

(86) PCT No.: PCT/JP00/04552

§ 371 (c)(1),
(2), (4) Date: Mar. 5, 2001

(87) PCT Pub. No.: WO01/05039

PCT Pub. Date: Jan. 18, 2001

(30) Foreign Application Priority Data

Jul. 7, 1999 (JP) .......................... 11-193542

(51) Int. Cl.⁷ .............................. H04N 7/12
(52) U.S. Cl. ............................... 375/240.03
(58) Field of Search ................ 375/240.03, 240.22, 375/240.23; 382/245, 246, 250, 251; 348/419.1; 341/65, 69, 59, 67; H04N 7/12

(56) References Cited

U.S. PATENT DOCUMENTS 3,717,851 A * 2/1973 Cocke et al. ............... 711/220
5,218,622 A * 6/1993 Fazel et al. ................ 375/240
5,786,780 A * 7/1998 Park et al. .................... 341/67
5,844,611 A * 12/1998 Hamano et al. ......... 375/240.2
6,388,588 B2 * 5/2002 Kitamura ..................... 341/67
6,404,933 B1 * 6/2002 Yamamoto .................. 382/251
6,449,394 B1 * 9/2002 Florencio .................... 382/246
RE37,912 E * 11/2002 Park et al. .................... 341/67

FOREIGN PATENT DOCUMENTS

EP      0 260 748       3/1988
JP      63-132530       6/1988
JP      1-276980       11/1989

* cited by examiner

Primary Examiner—Nhon Diep
(74) Attorney, Agent, or Firm—Frommer Lawrence & Haug LLP; William S. Frommer

(57) ABSTRACT

A recompression program 23 being a video edition software 20 executed by a personal computer 17 on a compressed video data supplied from a DV camera deck 11 or hard disc drive 12 and variable-length coded for conformance to the DV specification, compresses a variable-length code word by replacing one code word of a code word string of the variable-length code words with some other code word shorter than the one cord word and having a value approximate to that of the one code word.

12 Claims, 25 Drawing Sheets

| | CLASS NO.(CNO) | | | | AREA NO.(ANO) | | | |
|---|---|---|---|---|---|---|---|---|
| | 0 | 1 | 2 | 3 | 0 | 1 | 2 | 3 |
| QUANTIZER NO.(QNO) | 15 | | | | 1 | 1 | 1 | 1 |
| | 14 | | | | 1 | 1 | 1 | 1 |
| | 13 | | | | 1 | 1 | 1 | 1 |
| | 12 | 15 | | | 1 | 1 | 1 | 1 |
| | 11 | 14 | | | 1 | 1 | 1 | 1 |
| | 10 | 13 | | 15 | 1 | 1 | 1 | 1 |
| | 9 | 12 | 15 | 14 | 1 | 1 | 1 | 1 |
| | 8 | 11 | 14 | 13 | 1 | 1 | 1 | 2 |
| | 7 | 10 | 13 | 12 | 1 | 1 | 2 | 2 |
| | 6 | 9 | 12 | 11 | 1 | 1 | 2 | 2 |
| | 5 | 8 | 11 | 10 | 1 | 2 | 2 | 4 |
| | 4 | 7 | 10 | 9 | 1 | 2 | 2 | 4 |
| | 3 | 6 | 9 | 8 | 2 | 2 | 4 | 4 |
| | 2 | 5 | 8 | 7 | 2 | 2 | 4 | 4 |
| | 1 | 4 | 7 | 6 | 2 | 4 | 4 | 8 |
| | 0 | 3 | 6 | 5 | 2 | 4 | 4 | 8 |
| | | 2 | 5 | 4 | 4 | 4 | 8 | 8 |
| | | 1 | 4 | 3 | 4 | 4 | 8 | 8 |
| | | 0 | 3 | 2 | 4 | 8 | 8 | 16 |
| | | | 2 | 1 | 4 | 8 | 8 | 16 |
| | | | 1 | 0 | 8 | 8 | 16 | 16 |
| | | | 0 | | 8 | 8 | 16 | 16 |

FIG.6

HORIZONTAL →

|   | 0 | 1 | 2 | 3 | 4 | 5 | 6 | 7 |
|---|---|---|---|---|---|---|---|---|
| 0 | 1 | 2 | 6 | 7 | 15 | 16 | 28 | 29 |
| 1 | 3 | 5 | 8 | 14 | 17 | 27 | 30 | 43 |
| 2 | 4 | 9 | 13 | 18 | 26 | 31 | 42 | 44 |
| 3 | 10 | 12 | 19 | 25 | 32 | 41 | 45 | 54 |
| 4 | 11 | 20 | 24 | 33 | 40 | 46 | 53 | 55 |
| 5 | 21 | 23 | 34 | 39 | 47 | 52 | 56 | 61 |
| 6 | 22 | 35 | 38 | 48 | 51 | 57 | 60 | 62 |
| 7 | 36 | 37 | 49 | 50 | 58 | 59 | 63 | 64 |

VERTICAL ↓

FIG.8A

HORIZONTAL →

(SUM)

|   | 0 | 1 | 2 | 3 | 4 | 5 | 6 | 7 |
|---|---|---|---|---|---|---|---|---|
| 0 | 1 | 3 | 7 | 19 | 21 | 35 | 37 | 51 |
| 1 | 5 | 9 | 17 | 23 | 33 | 39 | 49 | 53 |
| 2 | 11 | 15 | 25 | 31 | 41 | 47 | 55 | 61 |
| 3 | 13 | 27 | 29 | 43 | 45 | 57 | 59 | 63 |

(DIFFERENCE)

|   | 0 | 1 | 2 | 3 | 4 | 5 | 6 | 7 |
|---|---|---|---|---|---|---|---|---|
| 4 | 2 | 4 | 8 | 20 | 22 | 36 | 38 | 52 |
| 5 | 6 | 10 | 18 | 24 | 34 | 40 | 50 | 54 |
| 6 | 12 | 16 | 26 | 32 | 42 | 48 | 56 | 62 |
| 7 | 14 | 28 | 30 | 44 | 46 | 58 | 60 | 64 |

VERTICAL ↓

FIG.8B

| (run, amp) | | CODE | LENGTH | (run, amp) | | CODE | LENGTH |
|---|---|---|---|---|---|---|---|
| 0 | 1 | 00s | 2+1 | 11 | 1 | 111100000s | |
| 0 | 2 | 010s | 3+1 | 12 | 1 | 111100001s | |
| EOB | | 0110 | 4 | 13 | 1 | 111100010s | |
| 1 | 1 | 0111s | 4+1 | 14 | 1 | 111100011s | |
| 0 | 3 | 1000s | | 5 | 2 | 111100100s | |
| 0 | 4 | 1001s | | 6 | 2 | 111100101s | |
| 2 | 1 | 10100s | 5+1 | 3 | 3 | 111100110s | |
| 1 | 2 | 10101s | | 4 | 3 | 111100111s | 9+1 |
| 0 | 5 | 10110s | | 2 | 4 | 111101000s | |
| 0 | 6 | 10111s | | 2 | 5 | 111101001s | |
| 3 | 1 | 110000s | 6+1 | 1 | 8 | 111101010s | |
| 4 | 1 | 110001s | | 0 | 18 | 111101011s | |
| 0 | 7 | 110010s | | 0 | 19 | 111101100s | |
| 0 | 8 | 110011s | | 0 | 20 | 111101101s | |
| 5 | 1 | 1101000s | 7+1 | 0 | 21 | 111101110s | |
| 6 | 1 | 1101001s | | 0 | 22 | 111101111s | |
| 2 | 2 | 1101010s | | 5 | 3 | 1111100000s | |
| 1 | 3 | 1101011s | | 3 | 4 | 1111100001s | |
| 1 | 4 | 1101100s | | 3 | 5 | 1111100010s | |
| 0 | 9 | 1101101s | | 2 | 6 | 1111100011s | 10+1 |
| 0 | 10 | 1101110s | | 1 | 9 | 1111100100s | |
| 0 | 11 | 1101111s | | 1 | 10 | 1111100101s | |
| 7 | 1 | 11100000s | 8+1 | 1 | 11 | 1111100110s | |
| 8 | 1 | 11100001s | | 0 | 0 | 11111001110s | 11 |
| 9 | 1 | 11100010s | | 1 | 0 | 11111001111s | |
| 10 | 1 | 11100011s | | 6 | 3 | 11111010000s | |
| 3 | 2 | 11100100s | | 4 | 4 | 11111010001s | |
| 4 | 2 | 11100101s | | 3 | 6 | 11111010010s | 11+1 |
| 2 | 3 | 11100110s | | 1 | 12 | 11111010011s | |
| 1 | 5 | 11100111s | | 1 | 13 | 11111010100s | |
| 1 | 6 | 11101000s | | 1 | 14 | 11111010101s | |
| 1 | 7 | 11101001s | | 2 | 0 | 111110101100 | |
| 0 | 12 | 11101010s | | 3 | 0 | 111110101101 | 12 |
| 0 | 13 | 11101011s | | 4 | 0 | 111110101110 | |
| 0 | 14 | 11101100s | | 5 | 0 | 111110101111 | |
| 0 | 15 | 11101101s | | | | | |
| 0 | 16 | 11101110s | | | | | |
| 0 | 17 | 11101111s | | | | | |

FIG.9

| (run, amp) | | CODE | | LENGTH |
|---|---|---|---|---|
| 7 | 2 | 1111101 10000s | | 12+1 |
| 8 | 2 | 1111101 10001s | | |
| 9 | 2 | 1111101 10010s | | |
| 10 | 2 | 1111101 10011s | | |
| 7 | 3 | 1111101 10100s | | |
| 8 | 3 | 1111101 10101s | | |
| 4 | 5 | 1111101 10110s | | |
| 3 | 7 | 1111101 10111s | | |
| 2 | 7 | 1111101 11000s | | |
| 2 | 8 | 1111101 11001s | | |
| 2 | 9 | 1111101 11010s | | |
| 2 | 10 | 1111101 11011s | | |
| 2 | 11 | 1111101 11100s | | |
| 1 | 15 | 1111101 11101s | | |
| 1 | 16 | 1111101 11110s | | |
| 1 | 17 | 1111101 11111s | | |
| 6 | 0 | 1111110000110 | | 13 |
| 7 | 0 | 1111110000111 | | |
| ⋮ R ⋮ | ⋮ 0 ⋮ | 1111110 | BINARY NOTATION OF R: R=6 TO 61 | |
| 61 | 0 | 1111110111101 | | |
| 0 | 23 | 111111100010111s | | 15+1 |
| 0 | 24 | 111111111111000s | | |
| ⋮ 0 ⋮ | ⋮ A ⋮ | 1111111 | BINARY NOTATION OF A: A=23 TO 255 | s |
| 0 | 255 | 111111111111111s | | |

FIG.10

| run \ amp | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | ... | 255 |
|---|---|---|---|---|---|---|---|---|---|---|---|---|---|---|---|---|---|---|---|---|---|---|---|---|---|---|
| 0 | 11 | 3 | 4 | (5) | 5 | (6) | 6 | (7) | 7 | (8) | 8 | 8 | 9 | 9 | 9 | 9 | 9 | 9 | 10 | 10 | 10 | 10 | 10 | 23 | ... | 16 |
| 1 | 11 | 5 | 6 | (8) | 8 | (9) | 9 | 9 | 10 | (11) | 11 | 11 | 12 | 12 | 12 | (13) | 13 | 13 | | | | | | (16) | | |
| 2 | 12 | 6 | 8 | (9) | 10 | 10 | 11 | (13) | 13 | 13 | 13 | 13 | | | | | | | | | | | | | | |
| 3 | 12 | 7 | 9 | (10) | 11 | 11 | 12 | (13) | 13 | | | | | | | | | | | | | | | | | |
| 4 | 12 | 7 | 9 | (10) | 12 | (13) | | | | | | | | | | | | | | | | | | | | |
| 5 | 12 | 8 | 10 | (11) | | | | | | | | | | | | | | | | | | | | | | |
| 6 | 13 | 8 | 10 | (12) | | | | | | | | | | | | | | | | | | | | | | |
| 7 | 13 | 9 | 13 | 13 | | | | | | | | | | | | | | | | | | | | | | |
| 8 | 13 | 9 | 13 | 13 | | | | | | | | | | | | | | | | | | | | | | |
| 9 | 13 | 9 | 13 | | | | | | | | | | | | | | | | | | | | | | | |
| 10 | 13 | 9 | 13 | | | | | | | | | | | | | | | | | | | | | | | |
| 11 | 13 | 10 | | | | | | | | | | | | | | | | | | | | | | | | |
| 12 | 13 | 10 | | | | | | | | | | | | | | | | | | | | | | | | |
| 13 | 13 | 10 | | | | | | | | | | | | | | | | | | | | | | | | |
| 14 | 13 | 10 | | | | | | | | | | | | | | | | | | | | | | | | |
| 15 | 13 | | | | | | | | | | | | | | | | | | | | | | | | | |
| ... | ... | | | | | | | | | | | | | | | | | | | | | | | | | |
| 61 | 13 | | | | | | | | | | | | | | | | | | | | | | | | | |

FIG.14B  $\underbrace{1111101111010}_{13}, \underbrace{1111101110001}_{13},...\underbrace{1111001000}_{11}$

FIG.14C  ...0, 7, 0, 0, 3,... ...0, 2,...

FIG.14D  $\underbrace{111010010}_{9}, \underbrace{111001100}_{9},$ ... $\underbrace{101010}_{6}$

FIG.18A QNO=6 → 1111101111010, 0, 15    (1, 15)
                    1111101110001, 0, 17    (2, 7)

FIG.18B QNO=5 → 111010010,    0, 7     (1, 7)
                    111001100,    0, 0, 3  (2, 3)

FIG.18C QNO=6 → 1111101111010, 0, 15    (1, 15)
                    1111100001010, 0, 0, 6  (2, 6)

```
static int sHuffmanReducible(int nAmp, int nRun)
{
  if(nAmp<0)
      nAmp=-nAmp;
  if((nAmp<3)||(nAmp>23))
      return 0;
  int nThisLength=sHuffmanLength(nAmp, nRun);
  int nNewLength=sHuffmanLength(nAmp-1, nRun);
  int nReduced=nThisLength-nNewLength;
  return(nReduced>0)?nReduced; 0;
}
static int sHuffmanReducibleToAmp0(int nAmp, int nRun, int nNextAmp, int nNextRun)
{
  int nThisLength=sHuffmanLength(nAmp, nRun);
  if(nNextRun==EOB){/*the end of data*/
      return nThisLength;
  }
  int nNextLength=sHuffmanLength(nNextAmp, nNextRun);
  int nNewLength=sHuffmanLength(nNextAmp, nRun+1+nNextRun);
  return nThisLength+nNextLength-nNewLength;
{
```

FIG.19

```
static BOOL sQStepReductionTable0[4][16] = {
    {0, 0, 0, 0, 1, 0, 0, 0, 0, 0, 0, 0, 0, 0, 0, 0 },
    {0, 0, 0, 1, 0, 0, 0, 1, 0, 0, 0, 0, 0, 0, 0, 0 },
    {0, 0, 1, 0, 0, 0, 1, 0, 0, 0, 1, 0, 0, 0, 0, 0 },
    {0, 1, 0, 0, 0, 1, 0, 0, 0, 1, 0, 0, 0, 0, 0, 0 }
};
static BOOL sQStepReductionTable1[4][16] = {
    {0, 0, 1, 0, 0, 0, 1, 0, 0, 0, 0, 0, 0, 0, 0, 0 },
    {0, 1, 0, 0, 0, 1, 0, 0, 0, 1, 0, 0, 0, 0, 0, 0 },
    {0, 0, 0, 0, 1, 0, 0, 0, 1, 0, 0, 1, 0, 0, 0, 0 },
    {0, 0, 0, 1, 0, 0, 0, 1, 0, 0, 0, 1, 0, 0, 0, 0 }
};
static BOOL sQStepReductionTable2[4][16] = {
    {0, 0, 0, 0, 1, 0, 0, 0, 1, 0, 0, 0, 0, 0, 0, 0 },
    {0, 0, 0, 1, 0, 0, 0, 1, 0, 0, 0, 1, 0, 0, 0, 0 },
    {0, 0, 1, 0, 0, 0, 1, 0, 0, 0, 1, 0, 0, 0, 1, 0 },
    {0, 1, 0, 0, 0, 1, 0, 0, 0, 1, 0,  , 0, 1, 0, 0 }
};
static BOOL sQStepReductionTable3[4][16] = {
    {0, 0, 1, 0, 0, 0, 1, 0, 0, 1, 0, 0, 0, 0, 0, 0 },
    {0, 1, 0, 0, 0, 1, 0, 0, 0, 1, 0, 0, 1, 0, 0, 0 },
    {0, 0, 0, 0, 1, 0, 0, 0, 1, 0, 0, 0, 1, 0, 0, 1 },
    {0, 0, 0, 1, 0, 0, 0, 1, 0, 0, 0, 1, 0, 0, 1, 0 }
};

static BOOL sQStepReducible(int nQno, int nClassNo, int nAreaNo)
{
    switch (nAreaNo) {
    case (3) :
            return sQStepReductionTable3[nClassNo][nQno];
    case (2) :
            return sQStepReductionTable2[nClassNo][nQno];
    case (1) :
            return sQStepReductionTable1[nClassNo][nQno];
    case (0) :
            return sQStepReductionTable0[nClassNo][nQno];
    default :
            return FALSE ;
    }
}
```

FIG.20

```
#define EOB 62
int RequantizeRunAmp(short* pRuns, short* pAmps, int nReducingSize, int nQno, int nClassNo)
{
    static int area[4] = {1, 6, 21, 43};

int nAreaEnd[4];

for (int i = 0; i < 4; i++) {
        nAreaEnd[i] = -1;
    } int nArea = 1;
    int nCoef = 0;

for (i = 0; pRuns[i] !=EOB; i++) {
        if (pRuns[i] > EOB)   // skip invalid entry
            coutinue;

nCoef += pRuns[i] + 1;

if ((nArea < 4) && (nCoef >= area[nArea])) {
            nAreaEnd[nArea-1] = i-1;
            nArea++;
        }
    } int nLastEntry = i-1;

for (i = 0; i <4; i++) {
        if (nAreaEnd[i] == -1) {
            nAreaEnd[i] = nLastEntry;
        }
    } int nTotalReducedSize = 0;

int nReducedSize;
    int nLastAmp;
    int nLastRun;
    int nLastPos;
``` a

FIG.21

```
for (i = 3; i > 0; i--) {                                                    ┌─b
    if (sQStepReducible (nQno, nClassNo, i))

if (nAreaEnd[i] < nLastEntry) {
            nLastPos = nAreaEnd[i]+1;
            nLastRun = pRuns[nLastPos];
            nLastAmp = pAmps[nLastPos];
        } else {
            nLastPos = nLastEntry;
            nLastRun = EOB;
        } int nPrevAreaEnd = (i>0)?nAreaEnd[i-1]:-1;

/*in present area, entires are replaced one after another beginning with higher-order ones*/
        for (int j = nAreaEnd[i] ; j > nPrevAreaEnd; j--) {
            if (pRuns[j] >= EOB)
                continue;

/*when amp is 1 or -1 or 0*/
            if ((pAmps[j] <= 1) || (pAmps[j] >= -1)) {
                nReducedSize = sHuffmanReducibleToAmp0(pAmps[j], pRuns[j], nLastAmp, nLastRun);
                if (nReducedSize >= 0) {
                    if (nLastRun == EOB) {
                        pRuns[j] = EOB;      // set the end of data
                    } else {
                        pAmps[j] = nLastAmp;
                        pRuns[j] += nLastRun + 1;   // run is add
                        pRuns[nLastPos] = 255;      // marking to indicate that entry is invalid
                    }
                }
            } else {
                /*amp takes other value*/
                nReducedSize = sHuffmanReducible(pAmps[j], pRuns[j]) ;
                if (nReducedSize > 0)
                    pAmps[j] -= (pAmps[j] >0) ?1:(-1) ; /*amp is replaced*/
            }                                                              ┌─d
            if (nReducedSize > 0) {
                nTotalReducedSize += nReducedSize;
                if (nTotalReducedSize >= nReducingSize)
                    return nTotalReducedSize;    /*end since target reduction has attained*/
            } nLastAmp = pAmps[j];
            nLastRun = pRuns[j];
            nLastPos = j ;
        }
    }
                                                                              ┐c
    return nTotalReducedSize;
}                                                                              ─e
```

FIG.22

| INPUT CODE WORD | NEW CODE WORD | INPUT(run, amp) →NEW(run, amp) |
|---|---|---|
| 1000s | 010s | (0, 3) → (0, 2) |
| 10110s | 1001s | (0, 5) → (0, 4) |
| 110010s | 10111s | (0, 7) → (0, 6) |
| 11011101s | 110011s | (0, 9) → (0, 8) |
| 1111111000101111s | 111101111s | (0, 23) → (0, 22) |
| 11010011s | 10101s | (1, 3) → (1, 2) |
| 11100111s | 1101100s | (1, 5) → (1, 4) |
| 1111100100s | 111101010s | (1, 9) → (1, 8) |
| 111110111101s | 1111101010101s | (1, 15) → (1, 14) |
| 11100110s | 1101010s | (2, 3) → (2, 2) |
| 111110111000s | 1111100011s | (2, 7) → (2, 6) |
| 111100110s | 111100100s | (3, 3) → (3, 2) |
| 11111011010111s | 11111010010s | (3, 7) → (3, 6) |
| 111100111s | 111001101s | (4, 3) → (4, 2) |
| 1111101101100s | 1111110100001s | (4, 5) → (4, 4) |
| 111110000000s | 111100100s | (5, 3) → (5, 2) |
| 1111101000000s | 111100101s | (6, 3) → (6, 2) |

FIG.23

|     | $Y_0$ | $Y_1$ | $Y_2$ | $Y_3$ | Cr | Cb |
|-----|-------|-------|-------|-------|-----|-----|
| MB0 | $B_0$ | $B_{01}$ | ... | ... | ... | $B_{05}$ |
| MB1 | $B_{10}$ | $B_{11}$ | | | | |
| MB2 | $B_{20}$ | : | ⋱ | | | |
| MB3 | $B_{30}$ | : | | ⋱ | | |
| MB4 | $B_{40}$ | : | | | | $B_{45}$ |

FIG.24

SIGNAL PROCESSING METHOD AND DEVICE

TECHNICAL FIELD

The present invention relates to a signal processing method and apparatus for processing a code word, and more particularly, to a signal processing method and apparatus suitably usable for processing a code word resulted from coding of a video signal.

BACKGROUND ART

In the conventional edition of a digital signal such as a still image, time-varying image, etc. (will be referred to simply as "image" hereinafter), one entire frame of the image is used as an edition unit. Especially, in case of a digital signal having been subjected to a variety of conversions such as compression, color space conversion, etc., the entire image is inversely converted back to its original signal (e.g., RGB signal), the original signal is edited and then reconverted. Generally, a digital signal of an image is compressed for transmission or storage since it includes a vast amount of data.

Referring now to FIG. 1, there is illustrated a procedure of editing one image frame of a so-called digital video (DV) signal. The edition of an image coded by the entropy coding or the like is shown.

As shown in FIG. 1, a digital signal supplied from a tape or hard disc is subjected to entropy decoding (at step S101), dequantization (at step S102), inverse discrete cosine transform (DCT) (at step S103) and RGB conversion block synthesis (at step S104), and data thus reconstituted is edited (at step S105).

The edited data is inversely converted. That is, it is subjected to YCbCr conversion blocking (at step S106), DCT (at step S107), quantization (at step S108) and entropy coding (at step S109).

Note that since an upper limit of code amount is determined for each of units forming together compressed video data such as DV signal compressed as in the above, the extent of compression has to be so controlled that the compressed video data can be accommodated in the code amount.

For example, the code amount in one video segment of a DV signal is set at a fixed length smaller than a predetermined code amount. Thus, conventionally, the code amount is controlled by making smaller the quantizer number in units of macro block for a rougher quantization, and Huffman coding being a variable-length coding, of the smaller quantizer number.

By this method, however, the video data is compressed more than necessary and the code amount becomes much smaller than a target code amount as the case may be, with a result that the image quality will be deteriorated more than necessary. In producing a high definition image in the fields of medicine, art and motion picture, for example, non-compressed video data is used for fear of an image quality degradation. Especially since repeated synthesis of video data will lead to a cumulation of image quality degradation, there is a tendency that use of a compressed video data will be avoided in such applications.

If a target code amount is not reached even by a one-step rougher quantization, it is necessary to repeat the quantization and variable-length coding until the target code amount is reached, which has been a large burden to the signal processing.

If the image quality degradation due to the expansion and recompression can be solved, it is expectable that the compression of video data such as a so-called DV signal will widely be accepted in the video edition.

DISCLOSURE OF THE INVENTION

Accordingly, the present invention has an object to overcome the above-mentioned drawbacks of the prior art by providing a signal processing method and apparatus in which an image quality can be maintained and signal processing such as quantization and variable-length coding be only a small burden in processing a code word of compressed video data.

The above object can be attained by providing a signal processing method in which an input signal is quantized to provide a sequence and the sequence is converted to a string of code words by variable-length coding of the sequence, including according to the present invention: a step of replacing one code word of the code word string with some other code word shorter than the one code word and having a value approximate to that of the one code word.

Also the above object can be attained by providing a signal processor in which an input signal is quantized to provide a sequence and the sequence is converted to a code word string by variable-length coding of the sequence, including according to the present invention: means for replacing one code word of the code word string with some other code word shorter than the one code word and having a value approximate to that of the one code word.

BRIEF DESCRIPTION OF THE DRAWINGS

FIG. 6 shows a quantization table indicating steps of quantization each with a quantizer number, class number and area number.

FIG. 8A shows a zig-zag scan in the 8-8-DCT block.

FIG. 8B shows a zig-zag scan in the 2-4-8-DCT block.

FIG. 9 shows a conversion of information from a pair (run, amp) to a variable-length code word.

FIG. 10 is a continuation of FIG. 9, showing a conversion of information from a pair (run, amp) to a variable-length code word.

FIG. 11 shows a relation between the variable-length code word and code length.

FIG. 14A shows a sequence of the zig-zag scan in FIG. 13A.

FIG. 14B shows the result of variable-length coding of the sequence in FIG. 14A.

FIG. 14C shows the quantized sequence in FIG. 14B.

FIG. 14D shows the result of variable-length coding of the quantized sequence in FIG. 14C.

FIG. 18A shows a first result of variable-length coding of a sequence.

FIG. 18B shows a second result of the variable-length coding of the sequence.

FIG. 18C shows a third result of the variable-length coding of the sequence.

FIG. 19 shows a program of a function to return a number of bits reduced by code word replacement.

FIG. 20 shows a program of a function to judge based on quantization information whether the number of bits can be reduced or not.

FIG. 21 shows a program of a function to replace a code word.

FIG. 22 also shows a program of a function to replace a code word.

FIG. 23 shows a code word replacement table.

FIG. 24 explains how to determine a target reduced number of bits for each block.

BEST MODE FOR CARRYING OUT THE INVENTION

These objects and other objects, features and advantages of the present invention will become more apparent from the following detailed description of the preferred embodiment of the present invention when taken in conjunction with the accompanying drawings. The preferred embodiment of the present invention is an editor for a so-called digital video (DV) signal.

The editor according to the present invention is intended to zero the degradation of a compressed signal by duplicating the signal as it is as possible in synthesis of a so-called DV signal, and compress the DV signal in units of variable-length code word only when the signal has to be requantized.

Figure 1:
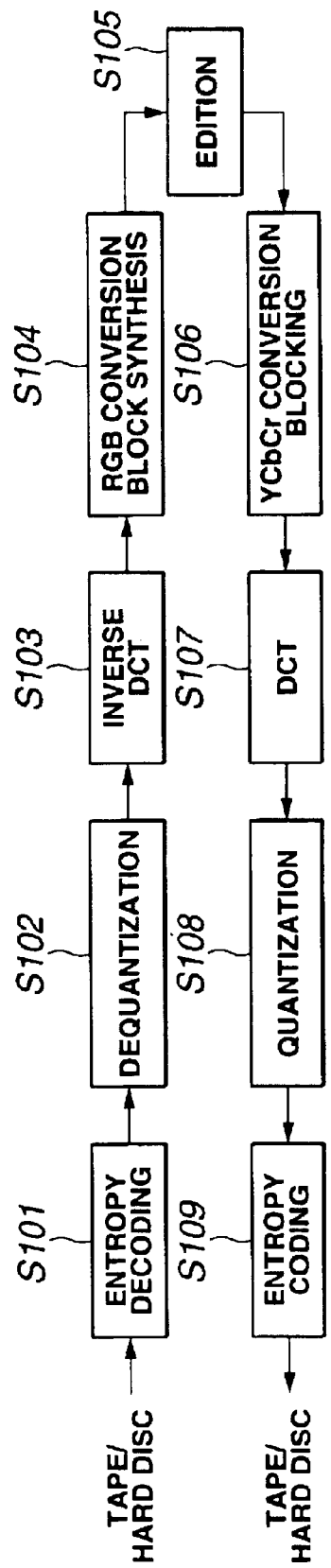
FIG. 1 shows an edition of a digital video signal.
Figure 2:
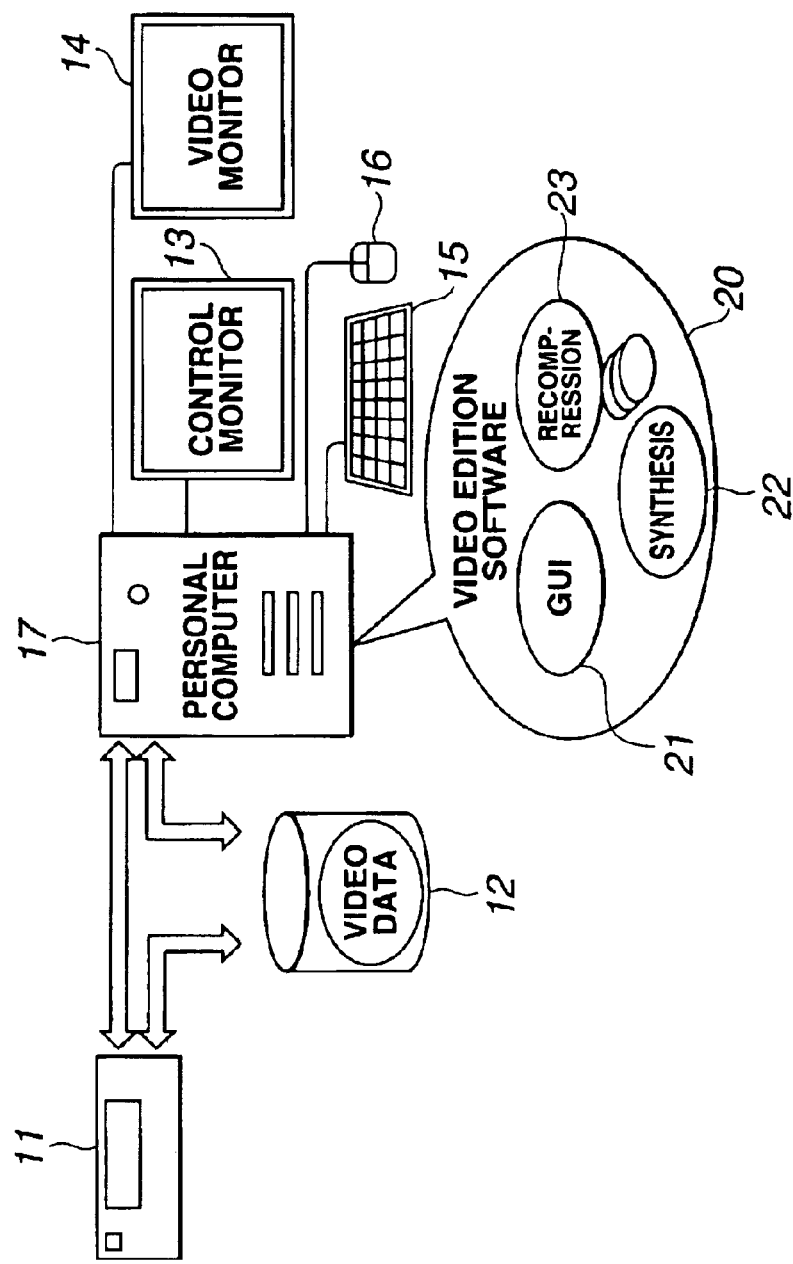
FIG. 2 is a schematic block diagram of an editor according to the present invention.

Referring now to FIG. 2, the editor according to the present invention is schematically illustrated in the form of a block diagram. As shown in FIG. 2, the editor includes a camera deck 11 to capture an image and provide a video signal, and a hard disc drive 12 to store video data. The camera deck 11 picks up an image to provide a video signal, and also records the video signal to a tape-shaped medium in which data is recorded in conformity with the so-called DV specification, namely, a so-called DV tape. Also, the camera deck 11 plays back video data recorded in the DV tape to provide a video signal.

The hard disc drive 12 is a large capacity recording medium to store so-called AV (audiovisual) data including video and sound data. The hard disc drive 12 transmits and receives video data to and from the camera deck 11 according to the so-called IEEE 1394 specification.

The editor further includes a control monitor 13 to display a controlled state and a video monitor 14 to display an image for the purpose of edition.

The control monitor 13 is provided to display to the user a controlled state such as a state of image processing in the editor. The control monitor 13 may use a cathode ray tube (CRT) capable of displaying characters and symbols for example.

The video monitor 14 is provided to display to the user video data being edited in the editor and video data having been edited by the editor. The video monitor 14 may also use a high definition CRT for example.

The editor includes also a keyboard 15 to enter character data and symbol data, and a mouse 16 to enter position information.

The keyboard 15 has a plurality of keys corresponding to characters and symbols and which are used to enter character data and symbol data. The mouse 16 is slidable on a flat surface, and when a button or buttons provided thereon is clicked, position information etc. are entered.

The editor includes also a personal computer 17 to edit video data and other data. The personal computer 17 incorporates a CPU, ROM, and RAM, etc. The personal computer 17 works as a self-sustaining information processor to effect video edition etc. according to a processing program recorded in the RAM for example.

The personal computer 17 incorporates a storage unit such as a built-in hard disc drive for example. The storage unit stores a video edition software 20 to edit video data.

That is, in the personal computer 17, the video edition software 20 includes a graphic user interface (GUI) 21, a synthesis program 22 to synthesize a plurality of images, and a recompression program 23 to recompress compressed video data having once been expanded.

Also, the video edition software 20 may be made as an LSI on a PCI board for example and installed in the personal computer 17 to work via a PCI bus.

In the video edition software 20, the recompression program 23 replaces one code word with some other code word when recompressing a variable-length code word according to the so-called DV specification, to effect a minimum quantization of the code word. That is, in this embodiment, the requantization of the code word is minimized to minimize the data degradation due to the requantization.

In the editor having the personal computer 17 as the main component, a video data is compressed according to the recompression program 23. The video compression effected in the editor will further be described later.

The personal computer 17 can transmit and receive video data etc. to and from the camera deck 11 according to the so-called IEEE 1394 specification for example. Also, it can transmit and receive video data to and from the hard disc drive 12 according to the so-called Ultra SCSI specification for example.

Next, the construction of the aforementioned editor will be described in connection with the video edition software 20.

Figure 3:
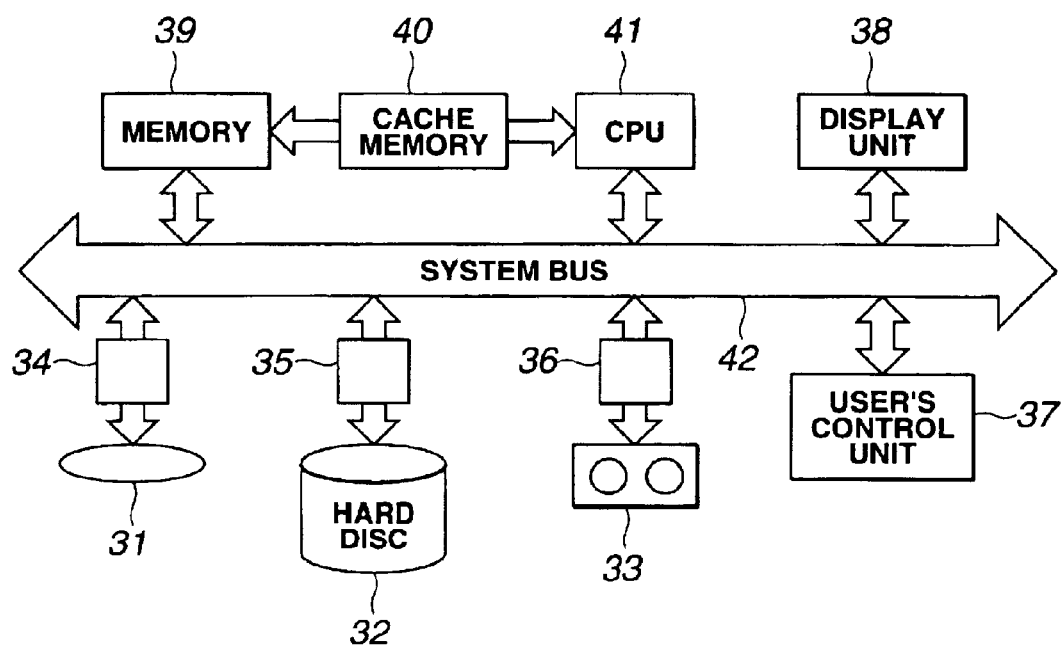
FIG. 3 is a block diagram of a portion of the editor in FIG. 2, related to a video edition software.

Referring now to FIG. 3, there is illustrated in the form of a block diagram a portion of the editor in FIG. 2, related to the video edition software 20. As shown, the editor is provided with a disc-shaped recording medium 31 such as a so-called CD or DVD, a hard disc 32, and a tape-shaped recording medium 33 such as a so-called DV tape. These recording media have recorded therein an image to be edited by the editor and the video edition software 20.

In the editor, the disc-shaped recording medium 31, for example, is inserted into the personal computer 17 when it is to be used. The hard disc 32 is provided in each of the hard disc drive 12 and personal computer 17. The tape-shaped recording medium 33 is used in the camera deck 11.

In the editor, the disc-shaped recording medium 31 transmits and receives data via a first interface 34, the hard disc drive 32 transmits and receives data via a second interface 35, and the tape-shaped recording medium 36 transmits and receives data via a third interface 36. The first, second and third interfaces 34, 35 and 36 adjust the data form transmitted over them and timing of data transmission over them.

The editor further includes a user's control unit 37 operated by the user to enter control data, and a display unit 38 to display characters and images.

The user's control unit 37 is operated by the user to provide control commands to the video edition software 20 executed by the editor, and the display unit 38 displays an executed state of the video edition software 30 in the editor and an image being edited according to the video edition software 20.

The editor further includes a memory 39 to store data, cache memory 40 to work as a high speed storage buffer, and a CPU 41 to execute the video edition software 20.

The memory 39 uses a volatile RAM or a non-volatile ROM to store video data and the video edition software 20. The cache memory 40 works along with the CPU 41 to buffer data at a high speed, thereby improving the data processing speed.

The CPU 41 processes data for video edition following the processing procedure in the video edition software 20 stored in the memory 39 for example. Any of the programs included in the video edition software 20 to be executed by the CPU 41 is selected based on a control command entered from the user's control unit 37, for example, operated by the user. The CPU 41 processes video data, and displays the processed video data on the display unit 38 and records the data to the disc-shaped recording medium 31, hard disc 32 or the tape-shaped recording medium 33.

The video data compressed according to the so-called DV specification, which is required for the image processing method adopted in the editor according to the present invention, will be described herebelow. The editor according to the present invention is intended for edition of video data compressed according to the so-called DV specification.

Figure 4:
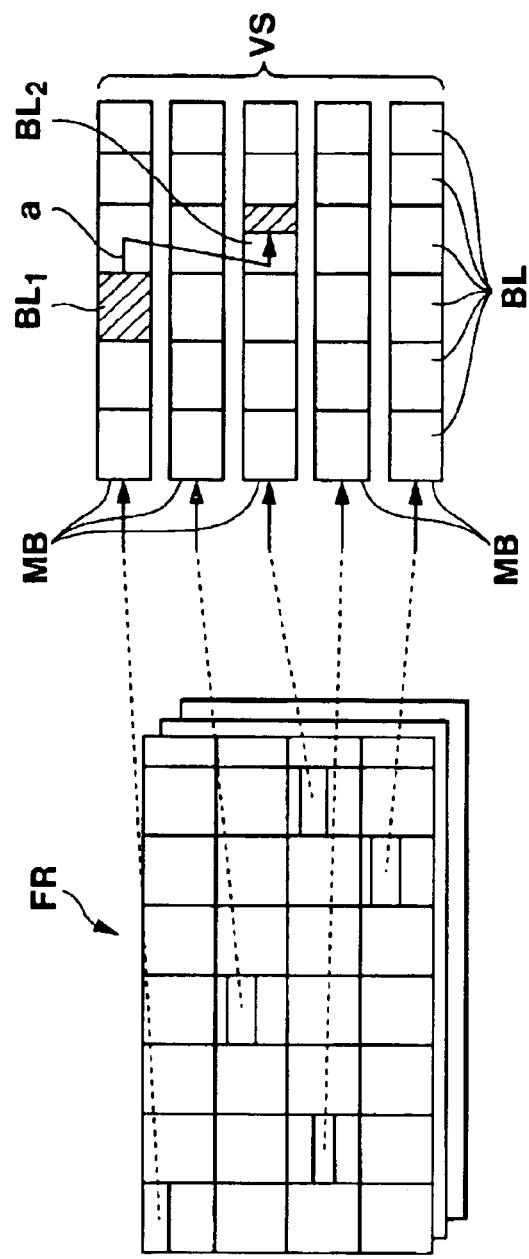
FIG. 4 shows a format conforming to the so-called DV specification.

Referring now to FIG. 4, there is outlined the specification of the so-called DV format. As shown, an image frame FR in the DV format is formed from fixed-length video segments VS.

Each of the video segments VS is further formed from five fixed-length compressed macro blocks MB. The compressed macro blocks MB included in each video segment VS is shuffled in one screen.

Each compressed macro block MB is formed from six compressed blocks BL. Valid data in each compressed block BL varies in length from one to another. Valid data is ended with a mark EOB (end of block) indicating the end of valid data in the block BL.

An area in which each compressed block BL is stored has a fixed top position and size. In case data to be recorded in one block BL cannot be accommodated in a fixed area, it will be recorded in another area.

More specifically, data which cannot be accommodated in the first area will be stored in a blank area in which no valid data is recorded, in another compressed block BL in a compressed macro block MB including the compressed block BL or in a video segment VS including the compressed macro block MB.

For example, data to be written in a first compressed block $BL_1$ is not accommodated in a first area as the case may be. In this case, the data not accommodated in the first compressed block $B_1$, is written into a blank area of a second block $B_2$, as indicated with an arrow a.

Figure 5:
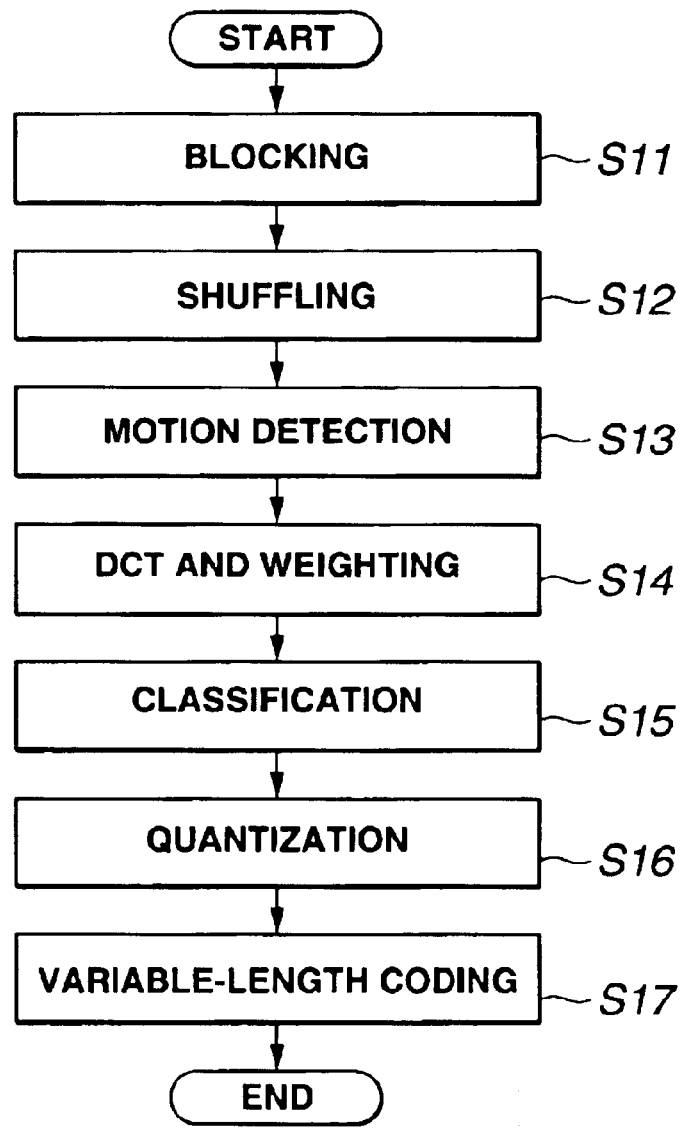
FIG. 5 is a flow chart of operations effected in generation of compressed video data according to the so-called DV specification.

Referring now to FIG. 5, there is given is a flow chart of operations effected in generation of compressed video data according to the so-called DV specification. The video compressing method according to the present invention is applied to a compressed video data conforming to the so-called DV specification A video signal compressed according to the so-called DV specification is normally formed from luminance signal Y, and two color-difference signals Cr and Cb. The color-difference signals Cr and Cb are sampled by a half of a frequency with which the luminance signal Y is sampled in units of image frames FR forming together the video signal. Further, the color-difference signals Cr and Cb are sampled to have their data halved.

At step S11, data in one image frame FR is divided into 8×8 blocks BL each being a basic unit of two-dimensional DCT (discrete cosine transform).

As mentioned above, since the luminance signal Y and color-difference signals Cr and Cb are sampled in different numbers, respectively, four blocks BL formed from pixels of the luminance signal Y take the same area at the same position in the same screen as one block BL of each of the color-difference signals Cr and Cb takes. One macro block MB is formed from these six blocks BL.

At step S12, five macro blocks MB forming together a video segment VS are collected from within the screen of one image frame FR by shuffling under a predetermined rule. The shuffling is intended to uniform information amount in each video segment VS. The video segment VS is compressed to have a fixed length so that it will not have more bits than predetermined.

At step S13, each block BL in the video segment VS is judged to be in a static or time-varying mode by detecting whether the object is moving in relation to the camera.

At step S14, each of the blocks BL in each video segment VS formed by shuffling at step S11 is subjected to DCT. Also, they are weighted as they go higher.

When it is determined at step S12 that the block BL is in the static mode, 8×8 pixels in the block BL are subjected to 8×8 two-dimensional DCT (8-8DCT) to provide an 8×8 DCT coefficient (will be referred to simply as "coefficient" hereinafter).

When it is determined at step S12 that the block BL is in the time-varying mode, a block BL formed from 8×8 pixels is divided into blocks each formed from first and second fields each of 4×8 pixels, and each field of 4×8 pixels is subjected to 4×8 two-dimensional DCT (4-8DCT). This DCT provides two sets of 4×8 DCT coefficients.

If it is thus determined at step S12 that the object is moving in relation to the camera, energy dispersion due to interlace can be prevented during DCT at step S14.

At subsequent steps S15 and S16, operations related to the quantization are W effected. The operations for the quantization according to the so-called DV specification is effected based on the quantization table shown in FIG. 6.

Each step of quantization applied to each coefficient depends upon a "quantizer number (QNO)" determined for each macro block MB, "class number (CNO)" determined for each block BL, and an "area number (ANO)" determined based on a frequency band of the coefficient in the DCT-transformed block BL.

A combination of these three numbers will be referred to as "quantization information" and will be written as <QNO, CNO, ANO>. The quantizer number, class number and area number will further be described below.

At step S14, a video segment VS including all DCT-transformed and weighted blocks BL is once stored in the buffer, and a quantizer to quantize the video segment VS is selected by estimating data amount of the video segment VS.

At step S15, each of the blocks BL in the video segment VS is classified by one of four classes as shown in the quantization table in FIG. 6. Each of quantization steps forming together the quantizer varies depending upon the class number CNO of the block BL.

Namely, a block BL having a larger class number has a larger activity and such a block BL has to be quantized relatively roughly.

Note that a block BL including a coefficient whose absolute value exceeds 255 has a class number (CNO) 3 and subjected to a process called "initial shift" before quantization. In the initial shift, the coefficient is divided by 2.

At step S16, a coefficient in each DCT-transformed block BL is divided by an integer called "quantization step". This operation is called "quantization" or "requantization". Actually, there is selected one of six types of quantizers prepared beforehand as shown in FIG. 6.

As the quantizer number (QNO) is smaller, the number of bits in a video segment VS is also smaller. Since each coefficient is roughly quantized when the quantizer number is smaller, an error due to the quantization, namely, quantization error, will increase and lead to an image degradation.

Therefore, a maximum quantizer number (QNO) which will not exceed a number of bits given to a video segment VS, namely, a target number of bits, is selected by estimating a code amount of the video segment VS. When a quantizer number is selected by the estimation of a code amount, the video segment VS stored in the buffer is actually quantized according to the quantizer number.

Figures 7A, 7B:
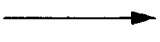
FIG. 7A shows an area division of an 8-8-DCT block.
FIG. 7B shows an area division of a 2-4-8-DCT block.

As shown in the quantization table in FIG. 6, each quantizer is formed from four quantization steps depending upon the class number (CNO). FIGS. 7A and 7B show an area division of an 8-8-DCT block for the static mode and an area division of a 2-4-8-DCT block for the time-varying mode, respectively. Each coefficient in one block BL is divided into four areas, and quantized at quantization steps for the divided areas, respectively.

When in the static mode, one block BL is formed from one DC coefficient and sixty three AC coefficients as shown in FIG. 7A.

When in the time-varying mode, each of blocks each originally including two 4×8 pixels is formed from one DC coefficient and thirty one AC coefficients as shown in FIG. 7B. For uniform handling of blocks BL in these two modes, respectively, however, each block of 4×8 pixels is subjected to DCT, and then a sum and difference are calculated between coefficients having the same order in each block BL to form a block BL of 8×8 pixels.

With this operation, the time-varying mode block BL can also be handled like the static-mode block BL as if it were formed from one DC coefficient and 63 AC coefficients.

At step S17, the quantized coefficient is further subjected to variable-length coding (VLC).

The variable-length coding is such that using the statistic property of the DCT coefficient, a shorter code is allocated to a coefficient having a higher probability of occurrence while a longer code is allocated to a coefficient having a lower probability of occurrence, to thereby reduce the statistic redundancy for an efficient coding. Thus, the variable-length coding is also called "entropy coding".

The variable-length coding adopted in this embodiment is called "modified two-dimensional Huffman coding". With this coding, a minimum mean code length can be defined for information whose probability of occurrence is known.

That is, at step S17, based on the probability of occurrence of coefficients in each block BL, a smaller number of bits (shorter code) is allocated to a coefficient whose frequency of occurrence is higher while a larger number of bits (longer code) is allocated to a one whose frequency of occurrence is lower, thereby reducing the mean number of bits allocated to each block BL.

More specifically, when in the static mode as shown in FIG. 8A, a code is allocated to a pair of a run length (will be referred to as "run") being a number of consecutive coefficients of zero and an amplitude (will be referred to as "amplitude") being a value of a non-zero coefficient following the rung length, namely, a pair (run, amp), in a one-dimensional sequence provided by zig-zag scan of quantized coefficients, as in the time-varying mode shown in FIG. 8B.

FIGS. 9 and 10 show together a conversion of a pair (run, amp) to a variable-length code word. As shown, a code word is given to a pair (run, amp) of an amp being an absolute value of non-zero coefficient in a sequence provided by the zig-zag scan and a run being a number of consecutive zero coefficients preceding the amp.

That is, the above technique utilizes the tendency that a sequence provided by quantizing coefficients and zig-zag scan of the quantized coefficients include many zeros and assures a high efficiency of compression by variable-length coding of a pair (run, amp) according to the probability of occurrence of the coefficient.

FIG. 11 shows a relation between the pair (run, amp) and code length. Namely, FIG. 11 uses the pair (run, amp) allocation in place of the code allocation in the variable-length code allocation table shown in FIGS. 9 and 10.

Each of the code words is set not to have more than sixteen bits including a sign bit. In this table in FIG. 11, a pair to which no code word is allocated is divided into two pairs by a following expression:

(run, amp)=(run−1, 0)+(0, amp)

Thus, a code word is always allocated to each of the pairs provided by the division.

Note that the encircled numerals in FIG. 11 indicate code words which can be compressed by replacement according to this embodiment. This code word replacement will further be described later.

Figure 12:
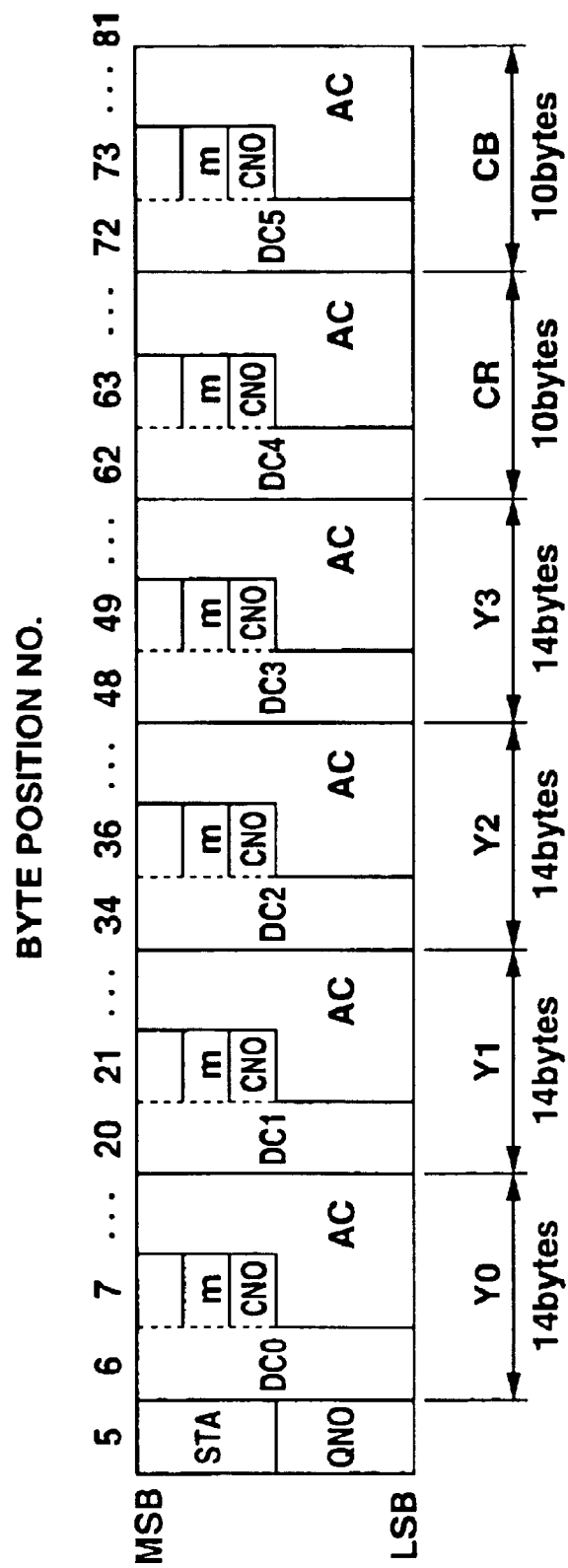
FIG. 12 shows a bit allocation to a compressed macro block.

The code word provided by coding at step S17 is allocated to a compressed macro block MB as shown in FIG. 12. The compressed macro block MB forms the video segment VS shown in FIG. 4.

At a byte position No. 5 in th formation of bit allocation to the compressed macro block MB shown in FIG. 12, STA (status of compressed macro block) for storage of error information of the compressed macro block is allocated to more significant four bits and a quantizer number (QNO) is allocated to less significant four bits.

Further, byte position Nos. 6 to 19 are allocated to the 0-th luminance block Y0 corresponding to the luminance signal Y, byte position Nos. 20 to 33 are allocated to the first luminance block Y1, byte position Nos. 34 to 47 are allocated to the second luminance block Y2, and byte position Nos. 48 to 61 are allocated to the third luminance block Y3.

Moreover, byte position Nos. 62 to 71 are allocated to a block BL corresponding to the color-difference signal CR, and byte position Nos. 72 to 81 are allocated to a block BL corresponding to the color-difference signal CB.

In each area allocated to each of these blocks BL, there are disposed first nine bits to DC coefficients, then a one-bit motion bit (m) indicating whether the block BL is in the time-varying mode, and a two-bit class number (CNO) taking a value of 0 to 3. In the other areas in each block BL, AC coefficients are disposed.

Next, coding for the video compression method according to this embodiment, of the DCT-transformed and weighted blocks BL provided as the result of the operations including down to the aforementioned step S14, will be described in detail.

Note that in the following, an coefficient being the i-th one ($0 \leq i \leq 7$) counted horizontally and the j-th ($0 < j < 7$) counted vertically in a block BL formed from 8×8 coefficients will be referred to as $a_{i,j}$.

Figure 13A:
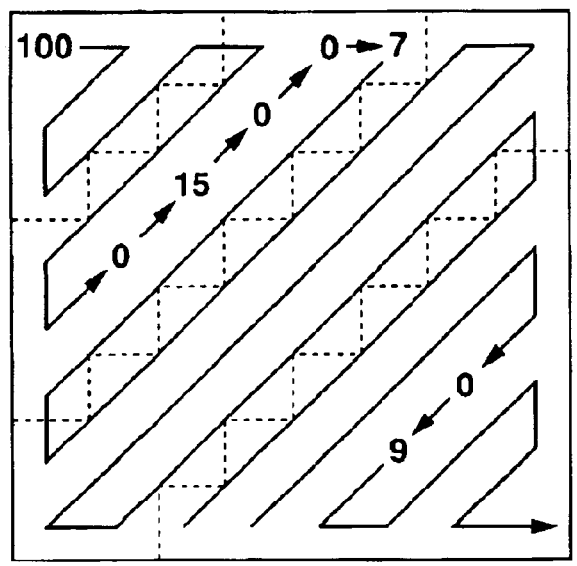
FIG. 13A shows a zig-zag scan of a block.

As shown in a block BL shown in FIG. 13A, of the zig-zag scanned DC coefficients shown in FIG. 8, namely, coefficient $a_{0,0}$ is shown as "100", coefficients $a_{1,3}$ to $a_{5,0}$ are shown as "0, 15, 0, 0, 7", and coefficients $a_{6,5}$ to $a_{5,6}$ are shown as "0, 9". Note that in the zig-zag scan, both coefficients $a_{0,4}$ immediately before coefficient $a_{1,3}$ and coefficient $a_{7,4}$ just before coefficient $a_{6,5}$ are not zero. Also it should be reminded that in the following, coefficient just before zero is not zero.

The pre-quantized block BL will be quantized by a class number (CNO) 0 and quantizer number (QNO) 5 according to the quantization table shown in FIG. 6. According to the representation of area numbers (ANO) in FIG. 7, the sequence "0, 15, 0, 0, 7" is covered by an area number 1, and so it corresponds to a quantization step of 2. Since the sequence "0, 9" is covered by an area number 3, it corresponds to a quantization step 4.

Figure 13B:
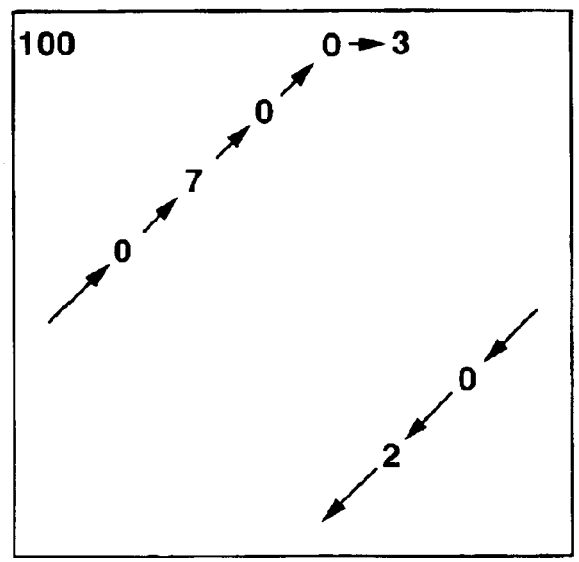
FIG. 13B shows a quantization of a sequence in FIG. 13A.

Therefore, in the quantized block BL, the sequence "0, 15, 0, 0, 7" will be a sequence "0, 7, 0, 0, 3" and sequence "0, 9" will be a sequence "0, 2", as shown in FIG. 13B.

According to the relation between the pair (run, amp) and code-length as in FIG. 11, the sequence "0, 7, 0, 0, 3" is represented by pairs (1, 7) and (2, 3) and sequence "0, 2" is represented by a pair (1, 2).

Therefore, according to the variable-length coding table shown in FIGS. 9 and 10, the sequence "0, 7, 0, 0 3" will be coded to code words "111010010" and "111001100" and the sequence "0, 2" will be to a code word "101010".

A code word thus obtained is decoded by reversely following the variable-length coding procedure, namely, with the same quantization information <QNO, CNO, ANO>.

The effect of the video compression by quantization will be described herebelow with reference to FIG. 14. Direct variable-length coding, without quantization, of the sequences "0, 15, 0, 0, 7" and "0, 9" obtained by the zig-zag scan, in the pre-quantized block BL shown in FIG. 13A will first be described with reference to FIG. 14A.

In this case, according to the relation between the pair (run, amp) and code length as in FIG. 11, the sequence "0, 15, 0, 0, 7" is represented by pairs (1, 15) and (2, 7) and sequence "0, 9" is represented by a pair (1, 9). Therefore, according to the variable-length coding table shown in FIGS. 9 and 10, the sequence "0, 15, 0, 0, 7" is coded to code words "1111101111010" and "1111101111001" and sequence "0, 9" is coded as a code word "11111001000" as shown in FIG. 14B. That is, the sequence "0, 15, 0, 0, 7" is coded to 13 bits and 13 bits, and sequence "0, 9" is coded to 11 bits.

On the other hand, the sequence 0, 7, 0, 0, 3" and "0, 2", provided by the zig-zag scan of the quantized coefficients as shown in FIG. 14C, are variable-length coded to a code word of 9 bits "111010010" and code word of 9 bits "111001100", and a code word of 6 bits "101010", respectively, as shown in FIG. 14D.

Therefore, by the variable-length coding after the quantization, it is possible to make a variable code length smaller than by variable-length coding without quantization. This is the effect of the quantization effected during the video compression.

Namely, the quantization reduces the code length for the sequence "0, 15" from 13 bits to 9 bits, the code length for the sequence "0, 0, 7" from 13 bits to 9 bits, and the code length for the sequence "0, 9" from 11 bits to 6 bits.

Oppositely to the quantization of the coefficients, when the coded sequence is expanded to a block BL, pairs (1, 7) and (2, 3) is provided from the code words "111010010" and "111001100", and a pair (1, 2) is provided from the code word "101010".

Figure 15A:
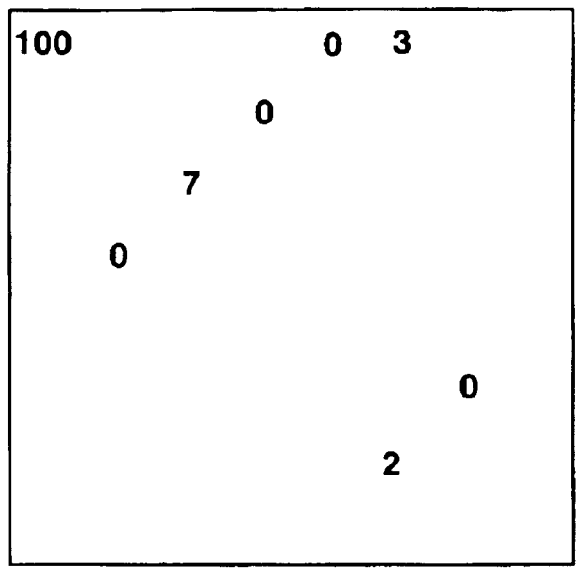
FIG. 15A is a block resulted from expansion of the coded sequence.

Further, taking the order of the reconstituted pair (run, amp) in consideration, sequence "0, 7, 0, 0, 3" and "0, 2" are provided as shown in FIG. 15A. Also, the DC coefficient evidently has a value of 100.

The quantized block BL is dequantized with the same class number (CNO) 0 and quantizer number (QNO) 5 as for the quantization. As mentioned above, the sequence "0, 15, 0, 0, 7" is a quantization step 2, and sequence "0, 9" is a quantization step 4. Dequantization by these quantization steps provide sequences "0, 14, 0, 0, 6" and "8, 0" as shown in FIG. 15B.

Figure 15B:
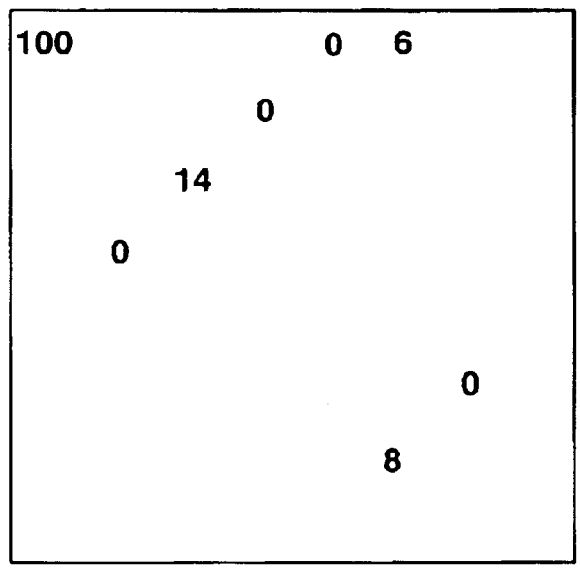
FIG. 15B shows the result of dequantization of the sequence in FIG. 14A.

Comparison of the block BL resulted from expansion of the code words, shown in FIG. 15B, with the block BL before compressed, shown in FIG. 13A, will reveal coefficients different from each other.

That is, the sequence shown in FIG. 13A is "0, 15, 0, 0, 7" while the sequence shown in FIG. 15A is "0, 14, 0, 0, 6". Also the sequence "0, 9" in FIG. 13A is "0, 8" in FIG. 15B. Thus, when a block BL is compressed to a code word and the cord word is expanded, the coefficients change in value from their original ones, which is a so-called degradation.

The compression by quantization and coding conforming to the so-called DV specification causes such a degradation but allows for the reduction of the code amount.

The video compression in this embodiment will further be described herebelow on the basis of the coding being the premise for the aforementioned video compression conforming to the so-called DV specification.

First, depending upon a combination of a code amount and quantization information <QNO, CNO, ANO>, different code words will be decoded to the same sequence in some cases.

Figure 16:
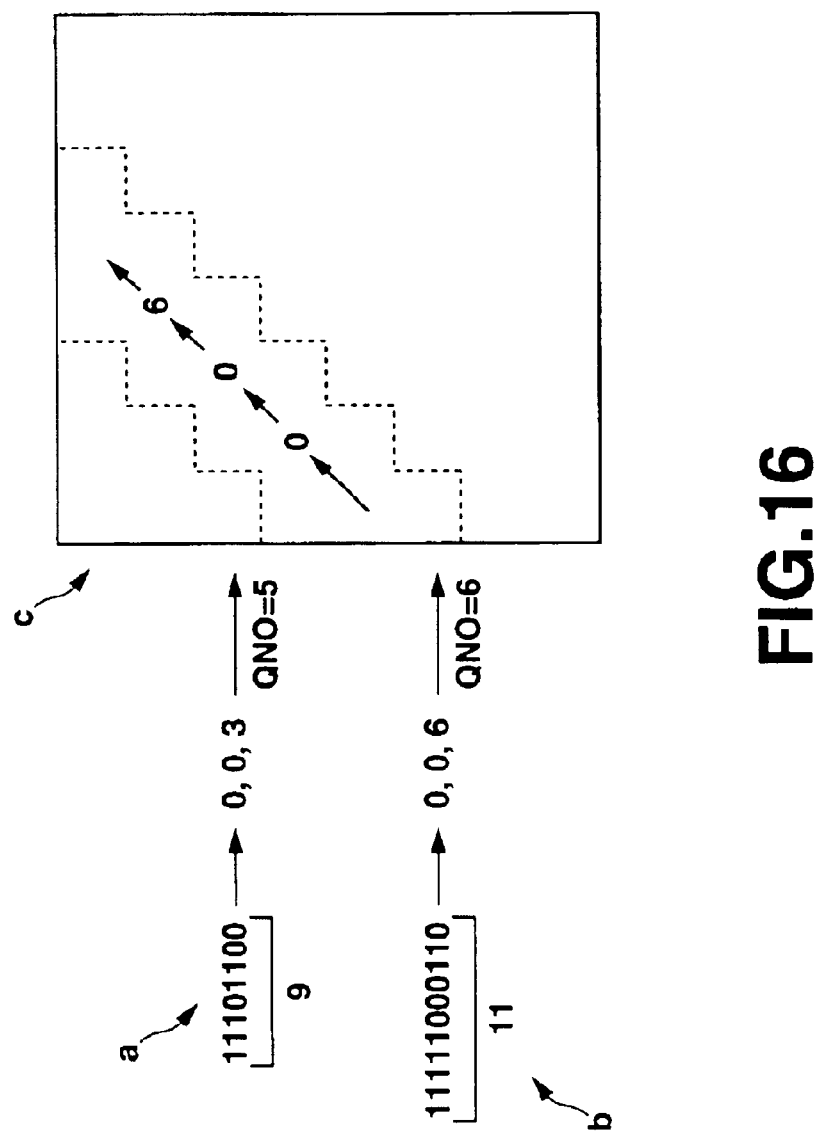
FIG. 16 shows an example in which the same result of expansion can be obtained by quantization with a different quantizer number.

For example, a 9-bit variable-length code word "111001100" shown with a reference a in FIG. 16, provided by variable-length coding based on quantization information <5,0, 1>, namely, with a quantizernumber (QNO) 5, class number (CNO) 0 and area number (ANO) 1, is converted to a pair (run, amp) (2, 3) according to the variable-length coding table shown in FIGS. 9 and 10 to provide a corresponding sequence "0, 0, 3".

The quantization step for the quantization information <5, 0, 1> is 2 as per the quantization table shown in FIG. 6.

Therefore, the variable-length code word is expanded to a sequence "0, 0, 6" of pre-quantized coefficients zig-zag-scanned within the area number (ANO) 1 as shown with a reference c in FIG. 16.

On the other had, a 11-bit variable-length code word "11111000110" provided by variable-length coding based on quantization information <6, 0, 1>, namely, with a quantizer number (QNO) 6, class number (CNO) 0 and area number (ANO) 1, as shown with a reference b in FIG. 16, is converted to a pair (2, 6) according to the variable-length coding table in FIGS. 9 and 10 to provide a sequence "0, 0, 6" of coefficients zig-zag-scanned within the area number 1 as shown with a reference c in FIG. 16. The quantization step for the quantization information <6, 0, 1>is 1 as per the quantization table in FIG. 6. Therefore, the variable-length code word is expanded to a sequence "0, 0, 6" of pre-quantized DCT coefficients.

As in the above, the different pieces of quantization information <QNO, CNO, ANO> are used to provide the same sequence "0, 0, 6" of DCT coefficients for the 9 bit code word "111001100 and 11-bit code word "11111000110", which suggests that by selecting appropriate quantization information <QNO, CNO, ANO>, it is possible to reduce the length of a code word provided by coding a sequence of zig-zag-scanned coefficients.

The video compression according to this embodiment is based on the fact that the same sequence can be provided even by different code words and quantization information in combination. More particularly, according to this embodiment, a minimum compression is enabled by replacing a code word with another without changing the quantization number (QNO) for example, more generally, without changing the quantization information <QNO, CNO, ANO>. That is, according to this embodiment, data degradation due to requantization is minimized by minimizing the requantization in units of code word.

Figure 17A:
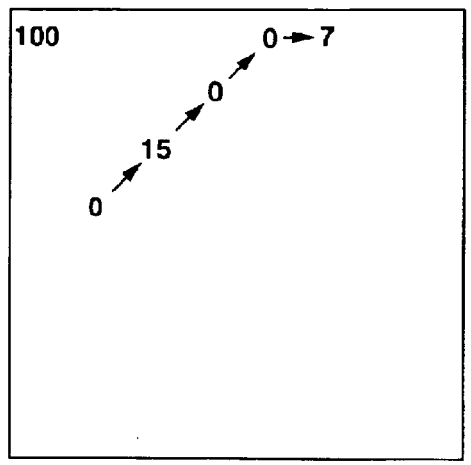
FIG. 17A shows a sequence in a block.

The video compression by replacing a code word with another without change of the quantizer number (QNO) according to this embodiment will be described in detail herebelow:

FIG. 17A shows a sequence "0, 15, 0, 0, 7" in a pre-quantized block BL, provided by zig-zag scan of coefficients, as in the pre-quantized block BL shown in FIG. 13A.

The sequence "0, 15, 0, 0, 7" is quantized based on quantization information <QNO, CNO, ANO> of <6, 0, 1>, namely, with a quantizer number (QNO) 6, class number (CNO) 0 and area number (ANO) 1.

According to the quantization table in FIG. 6, the quantization step in this case is 1. So, the quantization will not change the sequence "0, 15, 6, 0, 7". When quantized, the sequence "0, 15, 0, 0, 7" will be (1, 15) and (2, 7) as a pair (run, amp).

According to the variable-length coding table in FIGS. 9 and 10, 13-bit code words "1111101111010" and "1111101110001" corresponding to the sequence "0, 15, 0, 0, 7" are provided as shown in FIG. 18A.

These code words "1111101111010" and "1111101110001" thus variable-length coded will be expanded based on the same quantization information <6, 0, 1>as in the compression.

According to the variable-length coding table shown in FIG. 6, there are provided pairs (1, 15) and (2, 7) corresponding to the code words "1111101111010" and "1111101110001". Since the quantization step is 1 as mentioned above, the pairs (1, 15) and (2, 7) are expanded to its original sequence "0, 15, 0, 0, 7".

As in the above, the sequence "0, 15, 0, 0, 7" of the DCT coefficients is converted to the 13-bit code word in order to prevent degradation due to the compression and expansion for the variable-length coding.

Next, the video compression based on quantization information <5, 0, 1>, namely, with the quantizer number (QNO) changed from "6" to "5" will be described below:

With the coding having been described in the above with reference to FIG. 13, the sequence "0, 15, 0, 0, 7" in FIG. 17A is quantized to a sequence "0, 7, 0, 0, 3" based on quantization information <QNO, CNO, ANO> of 5, 0, 1 and a quantization step1.

Further, the sequence "0, 7, 0, 0, 3" is converted to pairs (run, amp) (1, 7) and (2, 3), and according to the variable-length coding table in FIGS. 9 and 10, it is variable-length coded to 9-bit code words "111010010" and "111001100" as shown in FIG. 18B.

Figure 17B:
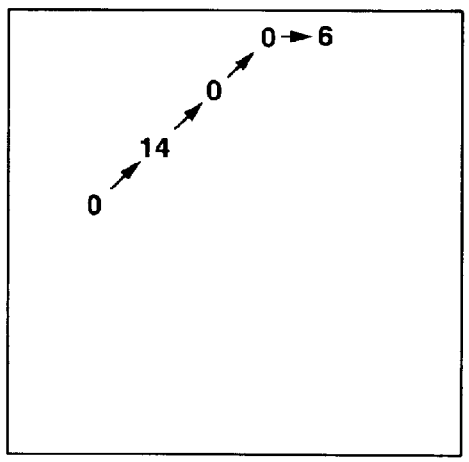
FIG. 17B shows the result of compression and expansion (companding) of the sequence in FIG. 17A.

The codewords "111010010" and "111001100" thus variable-length coded will be expanded, following reversely the coding procedure, to a sequence "0, 14, 0, 0, 6" shown in FIG. 17B and degraded because of the same quantization information <5, 0, 1> as in the compression.

The number of bits in the variable-length code words is smaller by a total of 8 bits, including the thirteenth to ninth bits, than that in the variable-length code word provided using the quantizer number (QNO) 6 selected to prevent the degradation of DCT coefficients due to the compression and expansion to the variable-length code words as in the above.

Figure 17C:
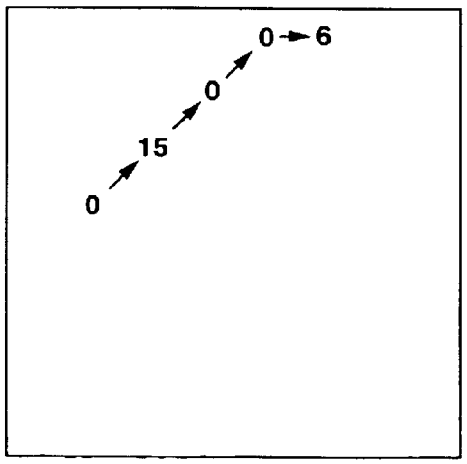
FIG. 17C shows the other result of compression and expansion of the sequence in FIG. 17A.

In the video compression according to this embodiment, a portion "0, 0, 7" of the sequence "0, 15, 0, 0, 0, 7" of DCT coefficients shown in FIG. 17A is replaced with "0, 0, 6" as shown in FIG. 17C, and then the sequence is quantized and variable-length coded with the quantizer number (QNO) 6 not changed.

When the quantization information <QNO, CNO, ANO> of <6, 0, 1> is used as it is as in the above, the sequence "0, 15, 0, 0, 6" provided as the replacement will not be changed by the quantization since the quantization step is 1.

The quantized sequence "0, 14, 0, 0, 6" is represented by pairs (run, amp) (1, 15) and (2, 6), and according to the variable-length coding table shown in FIGS. 9 and 10, a 13-bit code word "1111101111010" and 11-bit code word "11111000110" are provided as shown in FIG. 18C.

In the video compression method according to this embodiment, a sequence of zig-zag-scanned coefficients is partially replaced while the quantizer number (QNO) is being kept as 6. The number of bits in the variable-length code words is smaller by a total of 2 bits, including the thirteenth and eleventh bits, than that which would be when the quantizer number (QNO) 6 is selected to prevent the degradation of DCT coefficients due to the compression and expansion to the variable-length code words as in the above.

Also in the video compression method according to the embodiment, the quantizer number (QNO) is changed and a sequence of DCT coefficients is partially replaced. Thereby, the length of the code word when compressed is made smaller, however, with the DCT coefficients being degraded from the sequence "0, 0, 7" to "0, 0, 6" at due to the expansion, than that which would be when quantization conditions !<QNO, CNO, ANO> is selected, to thereby prevent DCT coefficients from being degraded due to the compression and expansion effected during the quantization and coding.

Further, the video compression method according to this embodiment provides a lower rate of compression than that which would be when a sequence is compressed by changing the quantizer number (QNO) within the range of quantization conditions <QNO, CNO, ANO>. However, since the same quantizer number (QNO) can be used, this video compression method is advantageous in that it will not adversely affect code words in other blocks BL and areas.

The video compression method according to this embodiment provides a compression by a partial replacement of a code word which will provide the same result of decoding as in a rougher quantization with the quantizer number (QNO) changed within quantization conditions <QNO, CNO, ANO> according to the variable-length coding table shown in FIGS. 9 and 10. For example, in the aforementioned example, compression is made with a portion "0, 0, 7" of a sequence replaced with "0, 0, 6" while the quantizer number (QNO) is being kept as it is.

In the video compression method according to this embodiment, the code length can also be reduced as the case may be by replacing a code word of amp=1 with a code word of amp=0 which is provided by quantizing amp=1 one step more roughly.

In the variable-length coding table shown in FIG. 11, encircled numerals indicate pairs (run, amp) of cord words which can be replaced in the video compression method according to this embodiment. As shown, the code words whose length can be reduced by replacement are:

(0, 3), (1, 3), (2, 3), (3, 3), (4, 3), (5, 3), (6, 3), (0, 5), (1, 5), (4, 5), (0, 7), (2, 7), (4, 7), (0, 9), (1, 9), (1, 15), (0, 23)

Note that the code words whose length can be reduced by the replacement can be determined using a function shown in FIG. 19 for example.

Next, a program of a function indicating a number of bits which are to be reduced by the code word replacement in the video compression method according to this embodiment will be described below with reference to FIG. 19:

In a function sHuffmanReducible for returning a reducible number of bits, a code word (nRun, nAmp) to examine the reducible number of bits is taken as an argument and the reducible number of bits is as a return value. When no reduction is made, the return value is 0.

The range of nAmp is nAmp>1 or nAmp<−1. Note that a function to return a reducible number of bits within other nAmp range will be described later.

In this function, first an absolute value of nAmp value is taken. If the absolute value is smaller than 3 and larger than 23, it is considered that no reduction is to be done. The return value will thus be 0. A function sHuffmanLength to return a code length is used to make a subtraction between the code lengths of nAmp and nAmp−1. When the difference, the result of the subtraction, is larger than 0, it is taken as the return value. Otherwise, the return value will be 0.

The function sHuffmanLength to return a code length is implemented according to the code word length table in FIG. 11.

The nAmp ranges of nAmp=−1, 0 and 1 not included in the function sHuffmanReducible will be handled by a function sHuffmanReducibleToAmp0. In this function, the return value is a reducible number of bits. When no reduction can be done, the return value will be 0 or a negative value.

This function uses as arguments a code word (nRun, nAmp) for which a reducible number of bits is to be determined and a next code word. First, when nNextRun of the next code word is EOB, the function sHuffmanLength is used to return a Huffman code word for which the reducible number of bits is to be determined.

Alternatively, the function sHuffmanLength is used to determine a difference in length of a code represented by (nNextRun, nRun+1+nNextRun) from a sum in code length of a code word for which a reducible number of bits is to be determined and a next code word. The difference is returned as a reducible number of bits.

In the video compression method according to this embodiment, it depends upon the quantization conditions <QNO, CNO, ANO>, that is, a set of a quantization number (QNO), class number (CNO) and an area number (ANO), whether or not the number of bits in a code word can be reduced.

The judgment under the quantization conditions <QNO, NCO, ANO> of whether or not the number of bits in a code word can be reduced is effected by a function sQstepReducible as shown in FIG. 20.

In this function, quantization conditions <nQno, nClassNo, nAreaNo>, that is, a quantizer number nQno, class number nClass No and nAreaNo, are taken as arguments. Referring to matrices sQStepReductionTable0, sQStepReductionTable1, sQStepReductionTable2 and sQStepReductionTable3, indicating, with a binary value, the quantization conditions and reducibility, there is returned a binary value of 1 or 0 to indicate whether the number of bits can be reduced or not.

According to the present invention, the aforementioned replacement is applied in the order from higher-order code word to lower-order one in a quantized block BL. FIG. 17C shows an example of this embodiment.

That is, it is judged by the function sQStepReducible whether under certain quantization conditions <QNO, CNO, ANO>, the number of bits in a variable-length code word can be reduced. Also, it is judged by the function sHuffmanReducible or sHuffmanReducibleToAmp0 whether the number of bits in a code word represented by a pair (run, amp) can be reduced.

These functions are used to replace code words. For example, a RequantizeRunAmp shown in FIG. 21 is used for the code word replacement. This function is intended to arrange the pairs (run, amp) in a block BL in the form of a matrix, enter a target number of bits after reduced, quantizer number (QNO) and a class number (CNO) and store the result of replacement in the matrix of the pairs (run, amp).

That is, the function RequantizeRunAmp uses as arguments the array (pRuns, pAmps) of the pairs (run, amp), target number of bits after reduced (nReducingSize) of the block BL, quantizer number (nQno) and class number (nClassNo) of the block BL.

With this function RequantizeRunAmp, operations will be done as in the following procedure. First, in a portion indicated with a reference a of FIG. 21, the matrix of input pairs (pRuns, pAmps) is divided into. That is, the array of the input pairs (pRuns, pAmps) is divided into areas as shown in FIG. 7.

In a portion b of FIG. 22, the function sQStepReducible to judge whether under the quantization conditions <QNO, CNO, ANO> shown in FIG. 20, the number of bits can be reduced, is used to examine if bits can be reduced from each of the divisional areas.

If it is judged by the function sQstepReducible in a portion c of FIG. 22 that the number of bits can be reduced, the function sHuffmanReducible or sHuffmanReducibleToAmp0 shown in FIG. 19 is used to examine the matrix (pRuns, pAmps) in each area to see whether the number of bits is reducible beginning with the last code word, namely, high-order code word. When it is determined that the number of bits is reducible, the code word is replaced to reduce the number of bits.

In a portion d of FIG. 22, a total number of bits having been reduced is examined each time one code word is replaced in the area. If the target reduced number of bits has been reached, the total of reduced number of bits is returned.

In a portion e of FIG. 22, the above operations have been done for the matrix (pRuns, pAmps) in all the areas. Thus, the final reduced number of bits is returned.

With the function RequantizeRunAmp, replacement has been done for the pair (run, amp). However, the DCT coefficient being a variable-length code can also be replaced directly according to a relation between an input code and new code as will be shown in FIG. 24.

For example, when a code "10000" is found in a replaceable area, it can be replaced with "0100" according to a correspondence table shown in FIG. 23.

In the course of reducing bits from bits-reducible code words in the order from the higher-order to lower-order one in a sequence of zig-zag-scanned coefficients in a block BL, when a target number of bits has been reached, no further replacement is necessary and the lower-order code words keep their respective original number of bits. Generally, important coefficients of video information are concentrated to the lower-order code words. When the number of bits of the lower-order code words are maintained, the image quality degradation will be small.

When no target code amount has not been reached for all code words in the block BL even with the aforementioned replacement, the quantizer number (QNO) is changed as in the method shown in FIG. 17B. If the target code amount is not yet reached, the replacement is done for the new quantizer number by the video compression method according to this embodiment. This is repeated until the target code amount is reached.

Note that for setting a target code amount for each block B1, a number of bits in excess of the data size of the video segment VS is distributed to each block BL as a reduction target Rmn for the block BL as shown in FIG. 24. The compression in units of code word is repeated for each block BL until the total of reduced code amount reaches Rmn.

Assume here that the code amount in each block BL before the compression is Bmn where m (0<m<4) is a number for a micro block ML and n (0<n<5) is a number for a block BL.

When the data size of the video segment VS is M bits, a number of bits R to be reduced for the whole video segment VS will be:

$$R=\Sigma_{i=0}^{4}\Sigma_{j=0}^{5}Bij-M$$

Thus, the reduction target Rmn for each block BL is determined from the following:

$$Rmn=R\times Bmn/\Sigma_{j=0}^{5}Bij$$

Also, the video compression method according to the present invention can be applied to the compression of an original image.

Conventionally, the compression is repeated some times down to a target number of bits for each block BL until a target code amount is reached. Namely, the requantization and variable-length coding following the requantization are repeated.

However, since the video compression method according to the present invention allows for a further compression "in units of code word" based on a compressed result, coding can be done to an amount more approximate to a target code amount.

Namely, the video compression method according to the present invention allows for more efficient utilization of a determined code amount and the image quality degradation will be correspondingly less. Further, since second and subsequent compressions are effected by replacement of code words, the compression can be made at a higher speed than the conventional method in which an entire block BL is recompressed.

Further, the video compression method according to the present invention can be used in processing a video data already compressed.

Generally, for a conventional image synthesis such as insertion of a title into a compressed video data or synthesis of a screen, an entire frame is reexpanded once for a desired processing, and then recompressed.

To more efficiently avoid image quality degradation due to calculation error, it has been proposed to expand and reexpand only a minimum necessary portion of a video data. In this proposed method, a digital signal is divided into blocks BL as a unit of processing and the digital signal is processed for each block BL. Thereby, only a minimum necessary image portion, for example, needing to be edited, of an entire image can be processed.

In this method, only a video data portion including a portion to be synthesized has to be expanded, synthesized and recompressed, and the remaining majority in a frame may be duplicated while being kept compressed.

Generally, however, a compressed video data has an upper limit defined for a code amount in a certain unit. When the compressed is just duplicated, the code amount will exceed the upper limit. In this case, some recompression will be required. This recompression can be effected efficiently and with less degradation by the video compression method according to the present invention.

Figure 25:
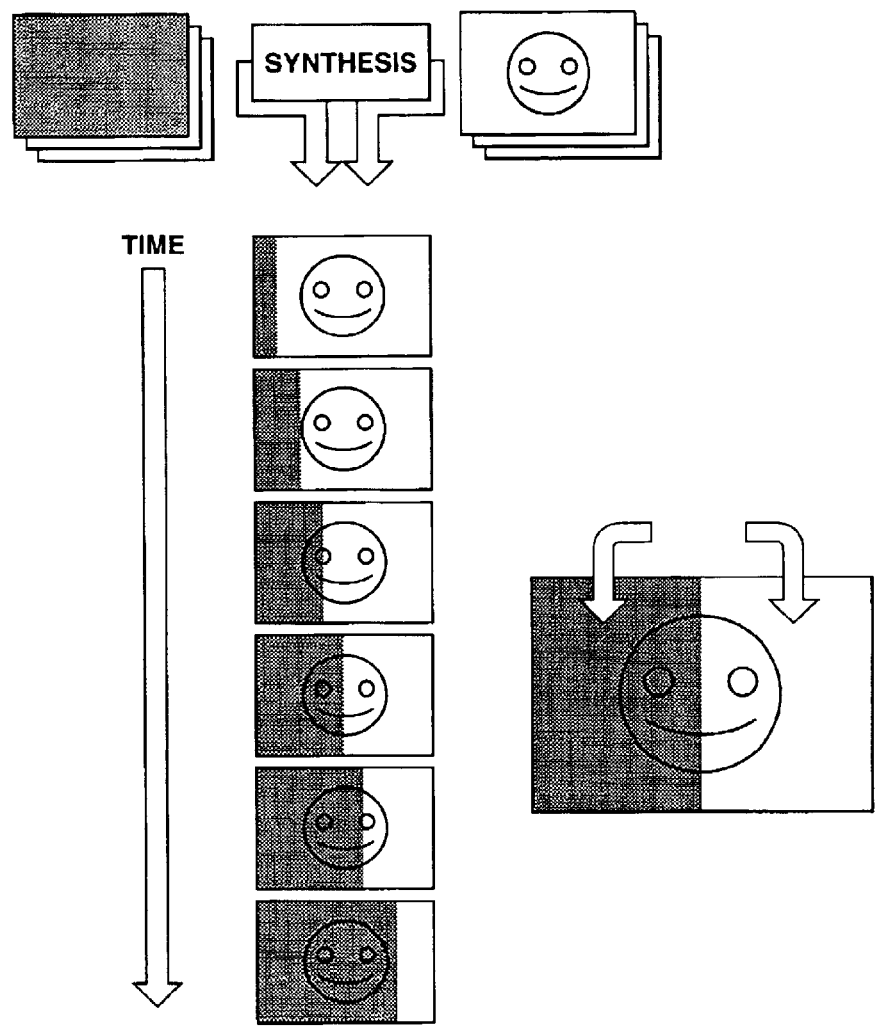
FIG. 25 shows a wiping.

Combining two input DV images A and B to synthesize an output image C will be described below with reference to FIG. 25:

At this time, blocks not concerning a synthetic boundary can be duplicated while being compressed. Blocks concerning the synthetic boundary can be expanded, compressed and then recompressed, for example, to generate a compressed synthetic block BL.

Assume here that of five macro blocks MB in a video segment VS, four are duplicated ones from a block A and one is a duplicated one from B or a synthetic block BL. At this time, the code amount of the duplicated block BL from the block B, or of the synthetic block BL, will exceed the data size of the video segment and have to be recompressed in some cases.

In such a case, the video compression method according to the present invention can effectively be used to compress the block at a level of variable-length code word.

Note that the embodiment of the present invention has been described in the foregoing on the assumption that it is applied to the so-called DV format but the present invention is not of course limited to this embodiment.

As having been described in the foregoing, the present invention allows for a further compression of a variable-length code word without having to change quantization information such as quantizer number etc.

Since video data can be compressed in units of code word by the video compression method according to the present invention, only high-order portion of DCT coefficients for example can be compressed without changing the low-order portion of the DCT coefficients, thereby providing an image with less degradation, namely, keeping more original signals therein. Thus, the present invention assures, even at worst, the same result as the convention compression method in which the quantizer number etc. are changed can do.

Further, since the compression can be done in small units such as code words, a code amount more approximate to a target one can be assured. Thus the present invention permits to effectively use the code amount.

Also, since a code word is just replaced not decoded, the present invention permits a simple and high speed processing. Coding effected according to the present invention will not easily come to nothing.

Moreover, when already compressed video data having been partially changed has to be compressed, the present invention permits to compress the video data without requantization and recoding.

What is claimed is:

1. A signal processing method in which an input signal is quantized to provide a sequence and the sequence is converted to a code word string by variable-length coding of the sequence, comprising:

a step of replacing one code word of the code word string with some other code word shorter than the one code word and representing a part of said sequence having a smaller amplitude than the amplitude of the sequence of said one code word.

2. The method as set forth in claim 1, wherein the other code word is a one equal to a code word provided by quantization of the one code word.

3. The method as set forth in claim 1, wherein the variable-length coding is an entropy coding by which a shorter code is allocated to a sequence whose probability of occurrence is higher.

4. The method as set forth in claim 1, wherein the sequence is represented by a pair of a run length (run) being a number of consecutive zeroes included before a non-zero numeral and an amplitude (amp) being the non-zero numeral and the one code word is replaced with some other code word corresponding to a pair in which "amp" is approximate to that in the initial pair.

5. The method as set forth in claim 1, wherein for pixels of a video signal, forming each input frame, the frame is divided into a plurality of blocks, the block is subjected to discrete cosine transform (DCT), a DCT coefficient of the DCT-transformed block is quantized based on quantization information, the DCT coefficient having been subjected to the quantization is arranged in a one-dimensional sequence, and then subjected to the variable-length coding.

6. The method as set forth in claim 5, wherein the code word replacement is effected in the order from the higher-order DCT coefficient to lower-order one in the sequence, and ended when a bit amount provided by the variable-length coding of the sequence is reached.

7. A signal processor in which an input signal is quantized to provide a sequence and the sequence is converted to a code word string by variable-length coding of the sequence, comprising:

means for replacing one code word of the code word string with some other code word shorter than the one code word and representing a part of said sequence having a smaller amplitude than the amplitude of the sequence of said one code word.

8. The signal processor as set forth in claim 7, wherein the other code word is a one equal to a code word provided by quantization of the one code word.

9. The signal processor as set forth in claim 7, wherein the variable-length coding is an entropy coding by which a shorter code is allocated to a sequence whose probability of occurrence is higher.

10. The signal processor as set forth in claim 7, wherein the sequence is represented by a pair of a run length (run) being a number of consecutive zeroes included before a non-zero numeral and an amplitude (amp) being the non-zero numeral and the one code word is replaced with some other code word corresponding to a pair in which "amp" is approximate to that in the initial pair.

11. The signal processor as set forth in claim 7, wherein for pixels of a video signal, forming each input frame, the frame is divided into a plurality of blocks, the block is subjected to discrete cosine transform (DCT), a DCT coefficient of the DCT-transformed block is quantized based on quantization information, the DCT coefficient having been subjected to the quantization is arranged in a one-dimensional sequence, and then subjected to the variable-length coding.

12. The signal processor as set forth in claim 11, wherein the code word replacement is effected in the order from the higher-order DCT coefficient to lower-order one in the sequence, and ended when a bit amount provided by the variable-length coding of the sequence is reached.

* * * * *